US006834377B2

(12) United States Patent
Baader et al.

(10) Patent No.: US 6,834,377 B2
(45) Date of Patent: Dec. 21, 2004

(54) METHOD FOR CHECKING AN INTEGRATED ELECTRICAL CIRCUIT

(75) Inventors: Peter Baader, München (DE); Burkhard Ludwig, München (DE)

(73) Assignee: Infineon Technologies AG, Munich (DE)

(*) Notice: Subject to any disclaimer, the term of this patent is extended or adjusted under 35 U.S.C. 154(b) by 111 days.

(21) Appl. No.: 10/368,334

(22) Filed: Feb. 18, 2003

(65) Prior Publication Data

US 2003/0159120 A1 Aug. 21, 2003

(30) Foreign Application Priority Data

Feb. 15, 2002 (DE) .......................................... 102 06 658

(51) Int. Cl.⁷ .............................................. G06F 17/50
(52) U.S. Cl. .................................. 716/5; 716/4; 716/6
(58) Field of Search .................... 716/4–6, 19; 703/1–2

(56) References Cited

U.S. PATENT DOCUMENTS

| | | | | | |
|---|---|---|---|---|---|
| 5,440,720 | A | * | 8/1995 | Baisuck et al. ................. | 703/2 |
| 6,063,128 | A | * | 5/2000 | Bentley et al. ................. | 703/6 |
| 6,131,182 | A | * | 10/2000 | Beakes et al. ................. | 716/8 |
| 6,385,761 | B1 | * | 5/2002 | Breid ............................. | 716/8 |
| 6,493,865 | B2 | * | 12/2002 | Fischer et al. ................. | 716/19 |
| 6,614,430 | B1 | * | 9/2003 | Rappoport .................... | 345/420 |
| 6,735,752 | B2 | * | 5/2004 | Manoo .......................... | 716/11 |
| 2001/0025229 | A1 | * | 9/2001 | Moritz et al. .................. | 703/1 |
| 2003/0229866 | A1 | * | 12/2003 | Allen et al. ..................... | 716/5 |

OTHER PUBLICATIONS

Kedem et al., "Graph–Optimization Techniques for IC Layout and Compaction", IEEE Transactions on Computer–Aided Design vol. CAD–3, No. 1, Jan. 1984, pp. 12–19.*

* cited by examiner

Primary Examiner—Vuthe Siek
Assistant Examiner—Naum Levin
(74) Attorney, Agent, or Firm—Laurence A. Greenberg; Werner H. Stemer; Gregory L. Mayback (57) ABSTRACT

A layout of an integrated electrical circuit on a memory unit of a computer system includes one or more instantiations of at least one circuit network description as well as information about the instantiations. A raw data structure represents the logical configuration of the layout and associates each instantiation with one, and only one, polygon data structure. A modified data structure is produced to represent the layout, which associates a circuit network description with one, and only one, polygon data structure, wherein the geometrical differences between the instantiations of this circuit network description are taken into account by variants in the polygon data structure.

44 Claims, 4 Drawing Sheets

METHOD FOR CHECKING AN INTEGRATED ELECTRICAL CIRCUIT

BACKGROUND OF THE INVENTION

Field of the Invention

The invention relates to a method for checking an integrated electrical circuit, which is in the form of a layout on a computer system, for faults caused by the manufacturing process or by the configuration of the integrated electrical circuit.

Checks such as these frequently make use of methods in which integrated electrical circuits are checked using proprietary manufacturer-specific design rule check rules or DRC rules. Furthermore, methods are feasible, in particular, test programs for detecting high-impedance circuit elements that cause faults and are connected to a number of circuit networks. These methods check the integrated electrical circuits for faulty circuit elements on a computer system by inserting "soft connects."

Methods such as these for checking integrated electrical circuits are dependent on the availability of a description that is as realistic as possible of the integrated electrical circuit to be checked, on a memory unit in a computer system, with this description being created such that conventional test procedures can be applied to the description.

Integrated electrical circuits are subdivided into a large number of electrical circuit networks that are connected to one another. The characteristics of these circuit networks are frequently stored in the form of polygon data structures in order to create a layout of the integrated electrical circuit, with these polygon data structures using polygons to represent the circuit configurations contained in the respective circuit network.

In such a case, a separate polygon data structure is produced for each circuit network, with information from a number of circuit networks, which match electrically and geometrically, in each case being combined to form a polygon data structure. In reality, integrated electrical circuits often contain different electrical circuit networks, which have the same electrical characteristics, or electrical characteristics that are very similar to one another, but in which the geometry of the circuit elements that they contain differs. Separate polygon data structures are frequently produced in each case for circuit networks such as these when creating a description of an integrated electrical circuit on a computer system.

When producing a large number of polygon data structures that are very similar to one another, one problem that arises is that a very large memory area is required to describe the basic integrated electrical circuit on a memory unit of a computer system. A further disadvantage in this case is that the formation of the data structure of the circuit description from the individual polygon data structures is highly time-consuming. Furthermore, the memory requirement and the time required for use of the test procedures described above for a circuit description such as this are very extensive. These disadvantages become even more important as the integrated electric circuits on which they are based becomes more extensive and more complex.

SUMMARY OF THE INVENTION

It is accordingly an object of the invention to provide a method for checking an integrated electrical circuit that overcomes the hereinafore-mentioned disadvantages of the heretofore-known devices and methods of this general type and that can be used to create an improved description of an integrated electrical circuit. The integrated electrical circuit is intended to be capable of being checked for faults quickly and reliably, using this description.

With the foregoing and other objects in view, there is provided, in accordance with the invention, a method for checking an integrated electrical circuit to be described by a layout including circuit network descriptions of the integrated electrical circuit, each of the circuit network descriptions being in a form of one of a file and a part of a file on a memory unit of a computer system and each of the circuit network descriptions having at least one polygon each representing one circuit element of the integrated electrical circuit and information regarding electrical characteristics of circuit elements of the integrated electrical circuit, the layout having instantiations of at least one circuit network description and information about a geometrical shape and a configuration of the instantiations with respect to one another, the layout being described by a raw data structure associating each instantiation of a circuit network description with only one polygon data structure, includes the step of carrying out with a computer program the steps of (a) selecting a circuit network description from the layout, (b) determining the instantiations of the circuit network description in the layout, (c) determining the respectively geometrically identical and geometrically different instantiations of the circuit network descriptions by analyzing polygon data structures, (d) forming variants for the instantiations of the circuit network descriptions and assigning the instantiations to these variants, geometrically different instantiations being combined into respectively different variants and geometrically matching instantiations being combined into respectively identical variants, (e) forming a new data structure associating the circuit network description with only one polygon data structure, geometrical differences between the instantiations of the same circuit network description being taken into account by variants in the polygon data structure, (f) storing the formed new data structure as one of a file and a part of a file on the memory unit of the computer system, and (g) checking the layout of the integrated electrical circuit using the new data structure stored in step f) for faults caused by a configuration of the integrated electrical circuit.

With the objects of the invention in view, there is also provided a method for checking an integrated electrical circuit to be described by a layout including circuit network descriptions of the integrated electrical circuit, each of the circuit network descriptions being in a form of one of a file and a part of a file on a memory unit of a computer system and each of the circuit network descriptions having at least one polygon each representing one circuit element of the integrated electrical circuit and information regarding electrical characteristics of circuit elements of the integrated electrical circuit, the layout having instantiations of at least one circuit network description and information about a geometrical shape and a configuration of the instantiations with respect to one another, the layout being extending over a number of levels disposed one above another, the layout being described by a raw data structure associating each instantiation of a circuit network description with only one polygon data structure, includes the step of carrying out with a computer program the steps of (a) selecting a circuit network description from the layout, (b1) selecting a highest level from the layout, (b2) determining the instantiations of the selected circuit network description on the level selected in step b1), (b3) forming difference polygons by comparing the instantiations on the level selected in step b1) in pairs, (b4) forming variants for instantiations having different difference polygons, (b5) checking the difference polygons acting on circuit network descriptions in a next-lower level, (b6) assigning the instantiations to the variants formed in step b4) based upon the difference polygons, (c1) selecting the next-lower level, (c2) determining the instantiations of the selected circuit network description on the level selected in step c1), (c3) forming difference polygons by comparing the instantiations on the level selected in step c1) in pairs, (c4) combining the difference polygons formed in step c3) with the previously formed difference polygons, (c5) checking the difference polygons acting on circuit network descriptions in a next-lower level, (c6) assigning the instantiations to the variants already having been formed based upon the difference polygons, (c7) forming further variants for instantiations having difference polygons differing from the difference polygons combined in step c4), (c8) assigning the instantiations found in step c7) to the variants formed in step c7), (d1) repeating steps b1) to b5), c1) and c8) in a loop until a lowest level in the layout has been reached, (e) forming a new data structure associating the circuit network description with only one polygon data structure, geometrical differences between the instantiations of the same circuit network description being taken into account by variants in the polygon data structure, (f) storing the formed new data structure as one of a file and a part of a file on the memory unit of the computer system, and (g) checking the layout of the integrated electrical circuit using the new data structure stored in step f) for faults caused by a configuration of the integrated electrical circuit.

With the objects of the invention in view, there is also provided a method for checking an integrated electrical circuit having circuit elements with electrical characteristics, including the steps of providing a layout describing the integrated electrical circuit, the layout having circuit network descriptions of the integrated electrical circuit, each of the circuit network descriptions being in the form of one of a file and a part of a file on a memory unit of a computer system, having at least one polygon each representing one of the circuit elements, and having information about the electrical characteristics of the circuit elements, having at least one of a plurality of instantiations of at least one circuit network description, the instantiations having a geometrical shape and a configuration, having information about the geometrical shape and the configuration of the instantiations with respect to one another, and being described by a raw data structure associating each instantiation of a circuit network description with only one of a plurality of polygon data structures, and carrying out the following steps with a computer program: (a) selecting a circuit network description from the layout; (b) determining the instantiations of the circuit network description in the layout; (c) determining the respectively geometrically identical and geometrically different instantiations of the circuit network descriptions by analyzing the polygon data structures; (d) forming variants for the instantiations of the circuit network descriptions and assigning the instantiations to the variants, geometrically different ones of the instantiations being combined into respectively different variants and geometrically matching ones of the instantiations being combined into respectively identical variants; (e) forming a new data structure associating the circuit network description with only one polygon data structure, geometrical differences between the instantiations of the same circuit network description being taken into account by variants in the polygon data structure; (f) storing the formed new data structure as one of a file and a part of a file on the memory unit of the computer system; and (g) checking the layout of the integrated electrical circuit using the new data structure stored in step f) for faults caused by a configuration of the integrated electrical circuit.

With the objects of the invention in view, there is also provided a method for checking an integrated electrical circuit having circuit elements with electrical characteristics, including the steps of providing a layout describing the integrated electrical circuit, the layout having circuit network descriptions of the integrated electrical circuit, each of the circuit network descriptions being in the form of one of a file and a part of a file on a memory unit of a computer system, having at least one polygon each representing one of the circuit elements, and having information about the electrical characteristics of the circuit elements, having at least one of a plurality of instantiations of at least one circuit network description, the instantiations having a geometrical shape and a configuration, having information about the geometrical shape and the configuration of the instantiations with respect to one another, extending over a number of levels disposed one above another, and being described by a raw data structure associating each instantiation of a circuit network description with only one of a plurality of polygon data structures, and carrying out the following steps with a computer program: (a) selecting a circuit network description from the layout; (b1) selecting a highest level from the layout; (b2) determining the instantiations of the selected circuit network description on the level selected in step b1); (b3) forming difference polygons by comparing the instantiations on the level selected in step b1) in pairs; (b4) forming variants for instantiations having different difference polygons; (b5) checking the difference polygons acting on circuit network descriptions in a next-lower level; (b6) assigning the instantiations to the variants formed in step b4) based upon the difference polygons; (c1) selecting the next-lower level; (c2) determining the instantiations of the selected circuit network description on the level selected in step c1); (c3) forming difference polygons by comparing the instantiations on the level selected in step c1) in pairs; (c4) combining the difference polygons formed in step c3) with the previously formed difference polygons; (c5) checking the difference polygons acting on circuit network descriptions in a next-lower level; (c6) assigning the instantiations to the variants already having been formed based upon the difference polygons; (c7) forming further variants for instantiations having difference polygons differing from the difference polygons combined in step c4); (c8) assigning the instantiations found in step c7) to the variants formed in step c7); (d1) repeating steps b1) to b5), c1) and c8) in a loop until a lowest level in the layout has been reached; (e) forming a new data structure associating the circuit network description with only one polygon data structure, geometrical differences between the instantiations of the same circuit network description being taken into account by variants in the polygon data structure; (f) storing the formed new data structure as one of a file and a part of a file on the memory unit of the computer system; and (g) checking the layout of the integrated electrical circuit using the new data structure stored in step f) for faults caused by a configuration of the integrated electrical circuit.

In accordance with another mode of the invention, following step d) or d1), steps a) to d) or d1), respectively, are repeated in a loop for further circuit network descriptions in the layout.

According to the invention, an integrated electrical circuit has one or more circuit networks, each having a large number of circuit elements. An integrated electrical circuit typically extends over a number of levels, by virtue of the way in which it is produced, in which case, circuit networks can extend over one or more levels. The circuit elements are defined by shape and characteristic information. A complete integrated electrical circuit is characterized by the circuit elements contained in it and by the information about their absolute and/or about their relative positions with respect to one another.

According to the invention, a description of an integrated electrical circuit is produced in the form of a layout on a computer system, in particular, on a screen or on an output unit such as a printer. The layout in this case includes descriptions of one or more circuit networks of the integrated electrical circuit under consideration, which are each stored in a file or in each case in a part of a file on a memory unit of the computer system. Each circuit network is in this case described by at least one polygon, with the polygons each representing one circuit element of the integrated electrical circuit. Each polygon is in this case associated with information about the electrical characteristics of the circuit elements.

The layout of the integrated electrical circuit, which may extend over a number of levels, is composed of at least one circuit network description as described above, and of information about the geometrical shape and the configuration of these circuit network descriptions with respect to one another. The individual circuit network descriptions are stored in separate files. Accordingly, one speaks of the circuit network descriptions being instantiated or inserted into the layout. If one layout contains the same circuit network more than once, then one speaks of the relevant layout containing a number of instantiations of one circuit network description.

According to the present invention, the layout is described by a raw data structure, which associates each instantiation of a circuit network description with one, and only one, separate polygon data structure. The polygon data structures in this case contain information about the electrical characteristics of the polygons that they contain, as well as connection information for these polygons. The raw data structure, furthermore, contains the linking information for the individual polygon data structures.

In a first step according to the invention, a description of a circuit network is selected from a layout on an integrated electrical circuit. In this case, the method according to the invention is applied to an extraction process. An extraction process means the determination and hierarchical storage of the circuit networks and components. In this case, the raw data structure is produced from the extraction. In addition to the determined circuit networks, the result of the extraction process also provides information about the geometrical shape and configuration of the instantiations of the circuit networks with respect to one another.

In the second method step, all the instantiations of the selected circuit network description in this layout are determined. If the layout extends over a number of levels, then a top-down approach is, preferably, used in this case, covering the levels in the layout hierarchically.

In the next step, these instantiations are checked for matches and differences, with the polygon data structures being analyzed. Variants are, then, formed for the instantiations of the circuit network description. Geometrically different instantiations are assigned to respectively different variants, and geometrically matching instantiations are assigned to respectively identical variants. The number of variants that are formed in the process is kept to a minimum.

The next step according to the invention provides for a new data structure to be formed, which associates each circuit network description with one, and only one, polygon data structure. The geometrical differences between instantiations in the same circuit network description are taken into account by the variants that were formed in the previous step and that are linked to the polygon data structure. The data structure so produced is stored as a file or as a part of a file on the memory unit of the computer system.

The layout of the integrated electrical circuit is now investigated, using the data structure so modified, for faults that have been caused by the configuration of the integrated electrical circuit or by the sequence of the production steps for manufacturing the integrated electrical circuit. The methods that are used in this case for checking, including design rule check rules as well as test procedures that operate with the insertion of soft connects, are known to those skilled in the art and do not need to be explained any further at this point.

One fundamental idea of the invention is for all the instantiations of the same circuit network description to be applied to one, and only one, polygon data structure. Instantiations are combined in a polygon data structure such as this, which, although they have electrically matching or very similar characteristics, have different geometries to one another, however. The geometrical differences between the electrically matching instantiations are taken into account by variants, which are associated with the polygon data structure that is formed. These variants contain only the delta information for the respective instantiations. This means that the complete information content of a polygon data structure is not applied for each variant and, instead of this, only the differences from the referenced polygon data structure are defined for each variant.

According to a further fundamental idea of the invention, an algorithm is provided for variant generation, which forms the polygon data structures based upon the electrical characteristics of the circuit elements that are represented by polygons, and forms the variants based upon the geometrical differences between the instantiations of circuit network descriptions that are in each case referenced by the same polygon data structure. This results in an exact geometric representation of the polygons being formed from a logical representation.

The data structure that is produced and stored using the method according to the invention occupies very little memory space in comparison to prior art data structures, and has a very compact memory form. The number of polygons to be stored is reduced considerably in comparison to the prior art methods.

The hierarchical level of the data structure that is created is far higher than in the case of the prior art methods, which leads to quicker formation of the data structure and to quicker processing, which is more efficient of memory, of the programs, in particular, test programs, which work on this data structure.

Furthermore, the method according to the invention can result in the production of an "as if flat" representation of circuit networks for the subsequent applications.

Particularly extensive and complex integrated electrical circuits that, until now, it has not been possible to check, or which it has been possible to check only to a limited extent, for faults caused by the configuration or the production process of the integrated electrical circuit can, now, advantageously be checked with computer assistance.

According to one embodiment of the invention, the layout of an integrated electrical circuit extends over a number of levels that are disposed one above the other. These levels correspond to the production-engineering levels of the integrated electrical circuit. The polygons and circuit network descriptions that are present on the levels of the layout correspond to the circuit elements and circuit networks that are present on the respective levels of the integrated electrical circuit.

In this embodiment of the invention, the situation is considered in which instantiations of circuit networks that electrically match or are very similar but that differ geometrically occur on different levels in a layout. A hierarchically constructed master network, which can be formed from a network list, is used in this case, which represents the logical configuration of the basic integrated electrical circuit.

In this embodiment of the method according to the invention, the following steps are carried out instead of the steps of determination of the instantiations of the circuit network description, determination of the geometrically identical instantiations and of the geometrically different instantiations, the formation of variants for these instantiations and the assignment of the instantiations to these variants.

First of all, the highest level in the layout is determined and is selected. The instantiations of the selected circuit network description on this level are determined and difference polygons are formed by comparing these instantiations in pairs, with these difference polygons representing the differences between the instantiations. Variants are, then, formed for instantiations that have different difference polygons. This is followed by a check to determine whether or not these difference polygons are connected to circuit network descriptions in the next-lower level in the layout. The instantiations in the selected level of the layout are, then, assigned to these variants based upon their difference polygons.

The next step in the method according to the invention includes the selection of the next-lower level in the layout. The instantiations of the selected circuit network description are determined on this level, and the difference polygons are formed by comparing the instantiations on this level in pairs. The difference polygons so formed are combined with the previously formed difference polygons. Once the difference polygons that act on circuit network descriptions in the next-lower level have been checked, the instantiations are assigned to the already formed variants based upon their difference polygons.

In the next step of the method according to the invention, further variants are formed for instantiations of the circuit network description whose difference polygons do not match the already formed difference polygons. Those instantiations that have such different difference polygons are assigned to the newly formed variants.

The next step in the method according to the invention provides for these steps to be repeated in the form of a loop. The end of the method according to the invention is reached when the lowest level in the layout has been processed in the final run through the loop.

This embodiment of the invention is based on the idea of the layout being processed hierarchically in levels. The above description started from the hierarchically highest level of the layout and was processed successively level by level until the lowermost level in the layout was reached. This is also referred to as a "top down" approach. A reverse procedure from the lowermost to the uppermost level is, likewise, feasible, that is to say, a "bottom up" approach.

This algorithm according to the invention for variant generation is very effective and very fast.

The hierarchy level that can be achieved can be set to very high by the embodiment of the invention. Circuit network descriptions that match electrically but that differ geometrically can, thus, be stored in a reliable manner that uses memory particularly optimally. The data structure that is produced is particularly suitable for subsequent applications, in particular, test procedures.

It is particularly advantageous for the method according to the invention to be carried out successively for two or more circuit network descriptions, in particular, for all the circuit network descriptions in the layout under consideration, in the form of a loop. This makes it possible to form a complete data structure, which uses the memory in a particularly optimum manner.

The invention also applies to a computer program for carrying out a method for checking an integrated electrical circuit. The computer program is in such a case configured such that a method according to the invention can be carried out once a layout or a part of a layout has been entered or selected. In this case, the method results in a modified data structure that uses memory in an optimal manner, and that can be used for subsequent applications, in particular, for test programs.

In accordance with a further mode of the invention, the method according to the invention is executed on a computer.

The computer program according to the invention results in a simple data structure that uses memory in an optimum manner and that allows improved checking of integrated electrical circuits as well as improving the delay time in comparison to the known data structures.

The invention also relates to a computer program that is contained on a memory medium that is stored in a computer memory, which is contained in a direct access memory or which is transmitted on an electrical carrier signal.

In accordance with an added mode of the invention, there is provided a computer-readable medium having computer-executable instructions for performing the method according to the invention.

The invention also relates to a data storage medium having such a computer program and to a method in which a computer program such as this is downloaded from an electronic data network, such as the Internet, to a computer that is connected to the data network. The method according to the invention is implemented in the "HERC" computer program.

In accordance with an additional mode of the invention, there is provided a storage medium having computer-executable instructions for performing the method according to the invention.

In accordance with yet another mode of the invention, there is provided a computer memory having computer-executable instructions for performing the method according to the invention.

The computer memory can be a random access memory or a direct access memory.

In accordance with yet a further mode of the invention, there is provided an electrical carrier signal carrying computer-executable instructions for performing the method according to the invention.

In accordance with yet an added mode of the invention, there is provided a data carrier having computer-executable instructions for performing the method according to the invention.

In accordance with yet an additional mode of the invention, there is provided a method for downloading a computer program for checking an integrated electrical circuit, including the steps of providing an electronic data network and downloading the computer program according to the invention from the electronic data network to the computer.

In accordance with a concomitant mode of the invention, the electronic data network is the Internet and the computer is connected to the Internet.

In summary, an algorithm such as this for variant generation can be configured as follows. The algorithm operates using record fields in which the data such as instantiations, variants, and polygons is stored. The recursive formation of components and the collection of the results are carried out "bottom up." As a side effect, the number of instantiations for each variant is counted. The components are in this case formed by first processing the polygons with a graph search and, then, by processing the search networks using a union find technique. The variant formation, the allocation of the numbers for the instantiations for each variant, the graph search of the polygons, and the connections through the cell levels and through the network descriptions are carried out by separate functions. Once the data has been determined, it is evaluated. The results are collected in "abstract records," which are not stored until the start of the evaluation phase. The recursion process that is used for variant formation is, preferably, carried out indirectly.

Other features that are considered as characteristic for the invention are set forth in the appended claims.

Although the invention is illustrated and described herein as embodied in a method for checking an integrated electrical circuit it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
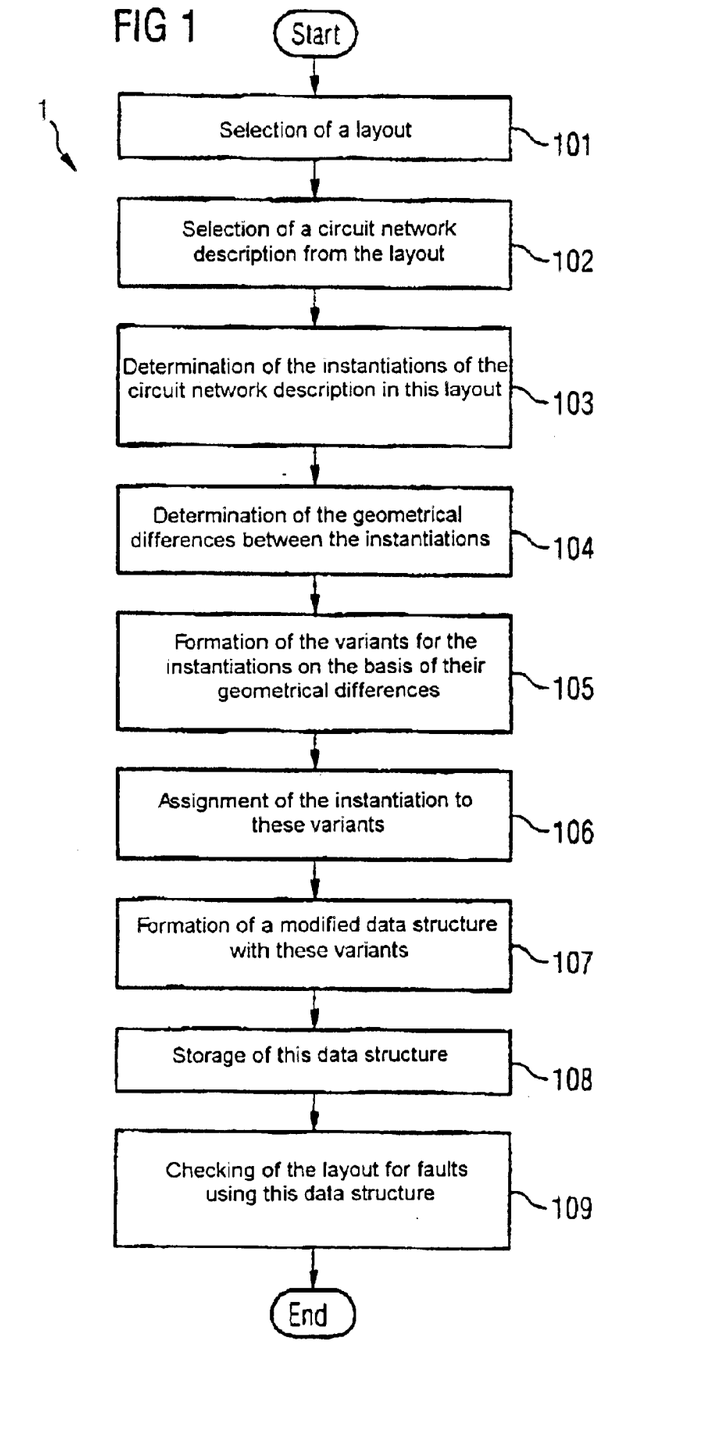
FIG. 1 is a flowchart illustrating a procedure for the method according to the invention.

Referring now to the figures of the drawings in detail and first, particularly to FIG. 1 thereof, there is shown a flowchart 1 that illustrates the procedure for the method according to the invention. The flowchart 1 is broken down into the method steps 101 to 109.

The first method step 101 according to the invention includes the selection of a layout of an integrated electrical circuit on a computer system, which is not shown here. An extraction process is used to create a circuit network description from the layout, with this circuit network description containing networks, active components such as MOS transistors, and passive components such as resistors. The method according to the invention is applied to an extraction process such as this, which creates a realistic description of the actual integrated electrical circuit from a number of circuit network descriptions that are held in a memory unit of the computer system as a file or as a part of a file.

Each circuit network description is composed of at least one polygon, which connects the components of the integrated electrical circuit. Each circuit network description contains information about the electrical characteristics of the circuit elements that it contains. The layout contains one or more uses or instantiations of at least one circuit network description. Furthermore, the layout has information about the geometrical shape and the electrical connection and/or the configuration and/or the instantiations with respect to one another.

The layout is logically described by a raw data structure, which associates each instantiation with one, and only one, polygon data structure.

In the second method step 102, a circuit network is selected from the layout. In the next, third method step 103, the instantiations of the selected circuit network description in the layout are determined.

This is followed by the fourth method step 104, in which the geometrical differences between the instantiations determined in the previous method step are determined. In the process, difference polygons are, preferably, determined, that is to say, polygons that describe the differences between the instantiations in the selected circuit network.

The subsequent fifth method step 105 provides for variants to be formed for the instantiations of the selected circuit network. The geometrical differences between the instantiations are determined by comparing the geometrical characteristics of the instantiations, in particular, of the difference polygons, in pairs. Variants for the instantiations are formed based upon the geometrical differences.

In the sixth method step 106, the instantiations are assigned to these variants, with geometrically different instantiations, in particular, instantiations with different difference polygons, being assigned to respectively different variants. Geometrically identical instantiations, in particular, instantiations that have no difference polygon, are in each case combined in the same variant.

The next, seventh method step 107 provides for the formation of a modified data structure using these variants. In this case, one, and only one, polygon data structure is produced for all the instantiations of the relevant circuit network description, containing all the information about the electrical and geometrical characteristics. The geometrical differences between the instantiations for the same circuit network description are taken into account by variants. These variants contain only the delta information, namely, the information describing the extent to which the respective instantiation differs geometrically from the referenced polygon data structure.

In the eighth method step 108, this data structure is stored as a file or as a part of a file on the memory unit of the computer system. The final, ninth method step 109 includes checking the layout for faults caused by the configuration or by the production process for the integrated electrical circuit. The data structure that has been modified and stored according to the invention is used for such a purpose. Checks such as these may be carried out, for example, using methods for checking integrated electrical circuits with the aid of design rule check rules or using test procedures that operate with the insertion of soft connects. Methods such as these are known to those skilled in the art, and do not need to be described at this point.

Figure 2:
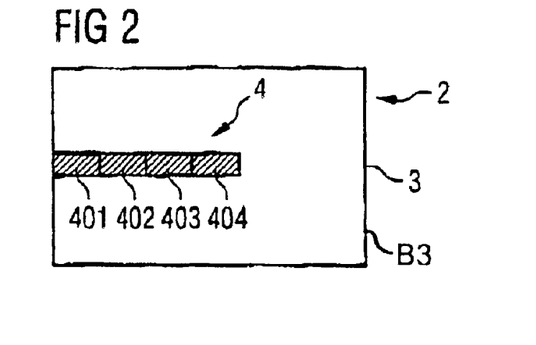
FIG. 2 is a diagrammatic illustration of a circuit element layout for a cell of one exemplary embodiment according to the invention.

FIG. 2 shows a schematic illustration of a circuit element layout 2 of a cell B3 according to one exemplary embodiment.

The cell B3 has a first circuit network description 4, which is subdivided into a first polygon 401, a second polygon 402, a third polygon 403, and a fourth polygon 404.

The cell B3 is rectangular, with the height corresponding to two thirds of the base side. The polygons 401 to 404 each have a rectangular shape, with the width in each case corresponding to twice the height. The width of the polygons 401 to 404 corresponds to one seventh of the width of the cell B3. The polygons 401 to 404, which are disposed alongside one another in a rising sequence, are each horizontally adjacent to one another, alongside one another, and are disposed vertically in the center of the cell B3. The first polygon 401, which is disposed furthest to the left, is terminated on its left-hand side by the left-hand side of the cell B3.

The shape and the dimensions of the polygons in the cell B3 in the exemplary embodiment should be regarded as being an example. In practice, the polygons may assume a large number of different shapes.

The cell B3 represents an image of a detail of an actual, integrated electrical circuit on a memory unit of a computer system. The first polygon 401, the second polygon 402, the third polygon 403, and the fourth polygon 404 represent electrical connections or connecting wires for the integrated electrical circuit.

Figure 3:
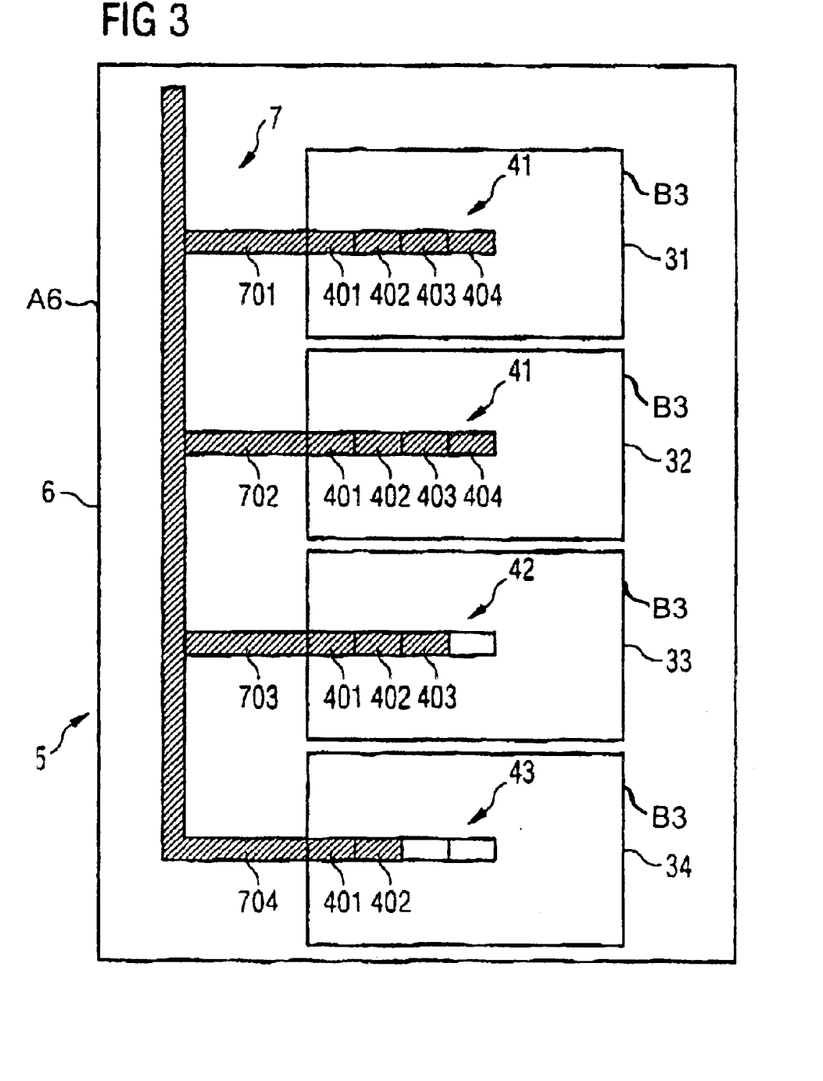
FIG. 3 is a diagrammatic illustration of a circuit layout of a cell of the exemplary embodiment according to the invention.

FIG. 3 shows a schematic illustration of a circuit layout 5 for a cell A6 according to the exemplary embodiment.

The circuit layout 5 in this case represents an image of a detail of an actual integrated electrical circuit on the computer system. This is a highly simplified example, namely relating to a wire. This wire can be produced as shown by the illustration in FIG. 3. To ensure the operation of the wire, additional devices and/or elements must, however, be provided.

The circuit layout 5 has a cell A6, which is subdivided into a first cell instance 31, a second cell instance 32, a third cell instance 33, a fourth cell instance 34 of the cell B3 and a second circuit network description 7.

The cell A6 has a rectangular shape, in which the width corresponds to three quarters of the height. The cell instances 31 to 34 are each usages of the cell B3 in the cell A6. Such use of cells in other cells is in this case referred to as instantiation. The cell instances 31 to 34 are disposed centrally with respect to the cell A6, in each case separated from one anther by a small distance vertically and horizontally. The width of the cell instances 31 to 34 corresponds approximately to two fifths of the width of the cell A6.

The first cell instance 31, which is disposed at the top, as well as the second cell instance 32, which is disposed underneath it, correspond precisely to the cell B3 in FIG. 2 in terms of the polygons 401 to 404 that they contain and in terms of their configuration with respect to one another. The third cell instance 33, which is disposed underneath the second cell instance 32, has the first polygon 401, the second polygon 402, and the third polygon 403. The fourth polygon 404 is missing in the third cell instance 33 in the cell B3. The shape and the configuration of the first polygon 401, of the second polygon 402, and of the third polygon 403 correspond to the shape and the configuration of the cell B3 that is shown in FIG. 2. The fourth cell instance 34 is disposed as the lowermost of the cell instances 31 to 34. This contains the first polygon 401 as well as the second polygon 402, with the shape and the configuration of these two polygons corresponding to the shape and the configuration of the cell B3 shown in FIG. 2. The third polygon 403 as well as the fourth polygon 404 are missing in the fourth cell instance 34 in the cell B3.

The second circuit network description 7 is subdivided into a fifth polygon 701, a sixth polygon 702, a seventh polygon 703, and an eighth polygon 704. The polygons 701 to 704 represent electrical connecting lines or wires.

The eighth polygon 704 is represented as a thin bar that starts shortly below the upper side of the cell A6 and runs downwards, separated by a short distance, parallel to the left-hand side of the cell A6. At the level of the center of the fourth cell instance 34, the eighth polygon 704 has a right-angled bend to the right, and, then, runs from this bend in the horizontal direction parallel to the lower side of the cell A6 and ends at the left-hand edge of the fourth cell instance 34. The eighth polygon 704 and the first polygon 401 of the fourth cell instance 34 of the cell B3 touch one another. There is an electrical contact between the electrical circuit elements that are represented by these two polygons.

The fifth polygon 701 runs horizontally parallel to the alignment of the cell A6, and is located between the eighth polygon 704 and the first polygon 401 of the first cell instance 31 of the cell B3. The sixth polygon 702, likewise, runs parallel to the alignment of the cell A6, and is disposed between the eighth polygon 704 and the first polygon 401 of the second cell instance 32 of the cell B3. The seventh polygon 703 is, likewise, aligned horizontally with respect to the cell A6, and is located between the eighth polygon 704 and the first polygon 401 of the third cell instance 33 of the cell B3.

The circuit network descriptions of the cell instances 31 to 34 have matching electrical characteristics, but have different geometrical characteristics.

The circuit network description of the first cell instance 31 and the circuit network description of the second cell instance 32 are also identical in terms of their geometrical characteristics, and are, thus, combined in a first circuit network variant 41.

In comparison to the first circuit network variant 41, the circuit network description of the third cell instance 33 has the first polygon 404, which, in this case, is referred to as a difference polygon. A second circuit network variant 42 is, accordingly, formed, in which the circuit network description is assigned to the third cell instance 33.

In comparison to the first circuit network variant 41, the circuit network description of the fourth cell instance 34 has the difference polygons 403 and 404, and it has the difference polygon 403 in comparison to the second circuit network variant 42. A third circuit network variant 43 is accordingly formed, to which the circuit network description of the fourth cell instance 34 is assigned.

The second circuit network description 7 is connected to the circuit network descriptions of the cell instances 31 to 34.

Figure 4:
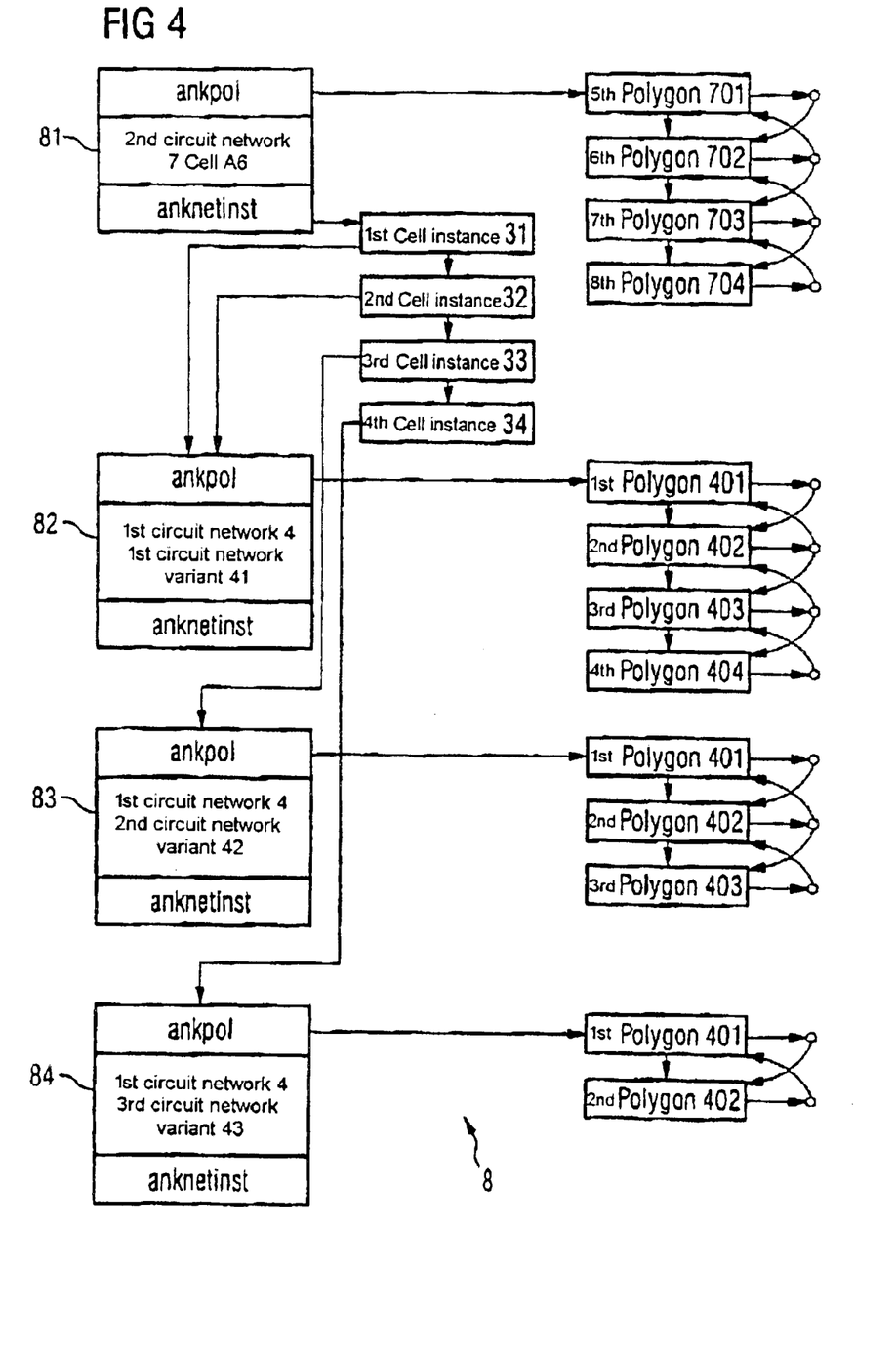
FIG. 4 is a diagrammatic illustration of a raw data structure for the circuit layout of FIG. 3.

FIG. 4 shows a schematic illustration of a raw data structure 8 of the circuit layout 5, as shown in FIG. 3, according to the exemplary embodiment.

The raw data structure 8 of the circuit layout 5 is subdivided into a first polygon data structure 81, a second polygon data structure 82, a third polygon data structure 83, and a fourth polygon data structure 84.

One polygon data structure in each case forms the logical configuration of the polygons of one cell or of one circuit network description as well as the link between the cell or the circuit network description and other cells, cell instances, or circuit network descriptions.

The polygon data structures 81 to 84 in this case each contain an anchor, which is shown as "ankpol" in FIG. 4, and a link to the polygons contained in the corresponding cell, as well as an anchor that is annotated "anknetinst" in FIG. 4 and a link to the cell instances to which the respective cells and cell instances are linked.

The raw data structure 8 shows the logical configuration of the polygon data structures 81 to 84 as well their relationships. Each cell or each cell instance is described by a polygon data structure. In the present case, each cell or each cell instance contains one, and only one, circuit network description. In a corresponding way, in order to simplify the illustration, it is assumed that one polygon data structure is created for each circuit network description.

The first polygon data structure 81 relates to the second circuit network 7 of the cell A6. The second polygon data structure 82 relates the first circuit network variant 41 of the first circuit network description 4. The third polygon data structure 83 is associated with the second circuit network variant 42 of the first circuit network description 4. The fourth polygon data structure 84 represents the logical configuration of the third circuit network variant 43 of the first circuit network description 4.

The first polygon data structure 81 of the second circuit network description 7 of the cell A6 contains a cross-reference to the polygons 701 to 704 that are contained in it. Furthermore, the first polygon data structure 81 contains a cross-reference to the cell instances 31 to 34. This means that, overall, the cell B3 is inserted into the cell A6 four times. The cell B3 is instanced in the cell A6 in three different circuit network variants 41 to 43.

The cell instances 31 and 32 that are combined in the first circuit network variant 41 are represented by the second polygon data structure 82. This contains a cross-reference to the polygons 401 to 404 that are contained in the cell instances of the first circuit network variant 41. The information about the electrical and geometrical characteristics of these polygons is stored in some suitable manner. This information can be accessed through the cross-reference "ankpol" to the second polygon data structure 82.

The first polygon data structure 81 is linked to the third polygon data structure 83 through the cross-reference "anknetinst" to the third cell instance 33. This third polygon data structure 83 contains information about the circuit network description, which is assigned in the second circuit network program 42, of the third cell instance 33. The third polygon data structure 83, thus, contains a cross-reference to the polygons 401 to 403. The geometrical and electrical information about the polygons 401 to 403 is stored in some suitable manner.

The first polygon data structure 81 is linked to the fourth polygon data structure 84 through the link "anknetinst" to the fourth cell instance 34 of the cell B3. The fourth polygon data structure 84 represents the geometrical and electrical information for the circuit network description, which is assigned in the third circuit network variant 43, of the fourth cell instance 34. The geometrical and electrical information for the polygons 401 and 402, which are contained in the third circuit network variant 43, are included in the fourth polygon data structure 84 through the link "ankpol".

The links "anknetinst" for the polygon data structures 82 to 84 are in an empty form because no further cells are instanced in the cell instances 31 to 34.

The mutual links between the polygons 701 to 704 of the first polygon data structure as well as the polygons 401 to 404 of the second polygon data structure 82, the polygons 401 to 403 of the third polygon data structure 83 as well as the polygons 401 and 402 of the fourth polygon data structure 84 are illustrated schematically in the form of arrows in FIG. 4. In this case, the illustration does not show the exact neighborhood relationships, but only the scheme.

Figure 5:
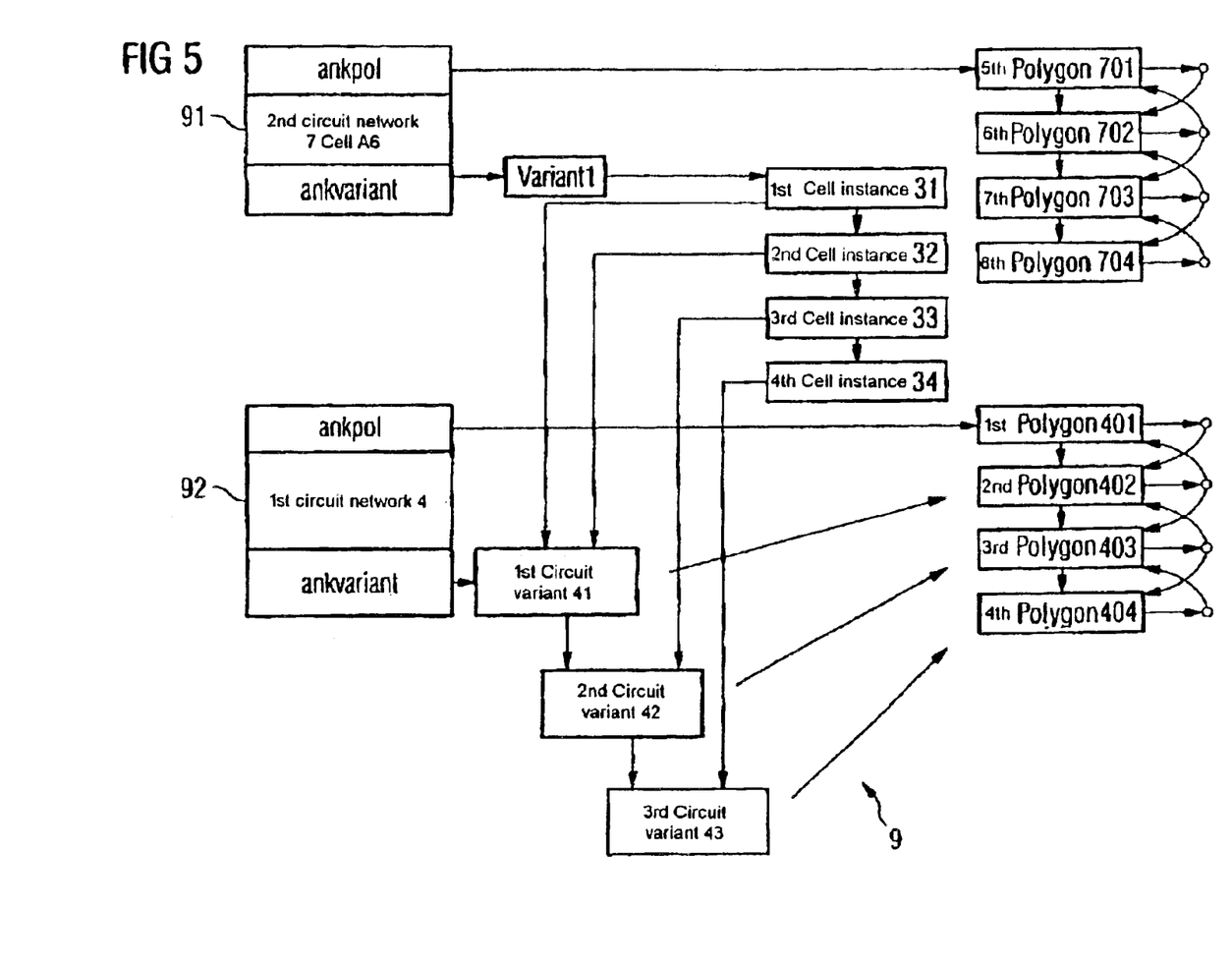
FIG. 5 is a diagrammatic illustration of a modified data structure for the circuit layout of FIG. 3.

FIG. 5 shows a schematic illustration of a modified data structure 9 of the circuit layout 5, as shown in FIG. 3, according to the exemplary embodiment.

The modified data structure 9 is subdivided into a fifth polygon data structure 91 and a sixth polygon data structure 92, and its information content matches that of the raw data structure 8. The fifth polygon data structure 91 represents the geometrical and electrical information for the second circuit network description 7 of the cell A6. The sixth polygon data structure 92 represents the geometrical and electrical information for the first circuit network description 4 for the circuit network variants 41 to 43.

The fifth polygon data structure 91 and the sixth polygon data structure 92 each contain an anchor or a link "ankpol" to the polygons that are contained in the respective circuit network. Furthermore, the polygon data structures 91 and 92 contain a link or an anchor "ankvariant" to the respectively instanced cells or circuit network descriptions.

The link "ankpol" for the fifth polygon data structure 91 cross-refers to the stored geometrical and electrical data for the polygons 701 to 704.

Only one variant is used in the fifth polygon data structure 91 because there is only one variant of the second circuit network description 7 for the cell A6. The link "ankvariant" cross-refers to this variant. Furthermore, the link "ankvariant" for the fifth polygon data structure 91 cross-refers to the cell instances 31 to 34 of the cell B3. However, these cell instances 31 to 34 are not cross-referenced, as in the case of the raw data structure 8 shown in FIG. 4, to respectively different polygon data structures, but to different variants of the same sixth polygon data structure 42. In detail, the first cell instance 31 and the second cell instance 32 are cross-referred to the first circuit network variant 41, the third cell instance 33 is cross-referred to the second circuit network variant 42, and the fourth cell instance 34 is cross-referred to the third circuit network variant 43. These circuit network variants 41 to 43 are referenced by the link "ankvariant" to the sixth polygon data structure 92 and contain the circuit-network-specific delta information for the individual cell instances. The cross-reference "ankpol" links the sixth polygon data structure 92 to the electrical and geometrical information for the polygons 401 to 404.

The first circuit network variant 41 contains the information that the circuit network description, which is stored in it, for the first cell instance 31 and for the second cell instance 32 matches the information that is stored under the link "ankpol". The second circuit network variant 42 contains the information that the circuit network description, which is stored in it, for the third cell instance 33 has a difference polygon with respect to the information stored under "ankpol," which describes its difference from the third cell instance 33. This difference polygon is the fourth polygon 404. The third circuit network variant 43 contains the delta information, which states that the variant stored under "ankpol" of the first circuit network 4 differs by two difference polygons from the circuit network description, which is stored in the third circuit network variant 43, for the fourth cell instance 34. The difference polygons are the third polygon 403 and the fourth polygon 404.

The difference polygons describe polygons that in some cases are not present, as in the present situation. The hierarchical path of the difference polygons is implicit in the data structure, but is required only when forming the data structure.

The method according to the invention will be described step-by-step in the following text using FIGS. 1 to 5. The method procedure is in this case based on the flowchart 1 shown in FIG. 1.

In the first step according to the invention, the circuit layout 5, which is illustrated in FIG. 3, is selected on a non-illustrated computer system. On the computer system, the circuit layout 5 is described by the raw data structure 8 shown in FIG. 4. After this, the first circuit network description 4 is selected from the circuit layout 5 and the four cell instances 31 to 34 are determined, which each contain instantiations of the first circuit network description 4.

The geometrical differences between the cell instances 31 to 34 are, then, determined. This is done by comparing the cell instances 31 to 34 in pairs, and by determining difference polygons. This information can also be obtained from the extraction process. In this case, the circuit network descriptions for the cell instances 31 and 32 are identical. The circuit network description for the third cell instance 33 differs from the circuit network descriptions for the cell instances 31 and 32 by the fourth polygon 404. The fourth polygon 404 is, thus, the difference polygon, which distinguishes the cell instances 31 and 32 from the third cell instance 33. The fourth cell instance 34 differs from the cell instances 31 and 32 by the third polygon 403 and the fourth polygon 404, which in this case represent the difference polygons.

Variants that take account of the geometrical differences in the shape of the difference polygons are, then, formed for the cell instances 31 to 34. In the present case, the first circuit network variant 41 is formed first of all. This contains the identical circuit network descriptions for the first cell instance 31 and for the second cell instance 32 of the cell B3. The second circuit network variant 42 is, then, produced and contains the circuit network description for the third cell instance 33. The third circuit network variant is, then, produced and has the circuit network description for the fourth cell instance 34.

In the next step according to the invention, the first cell instance 31 and the second cell instance 32 are assigned to the first circuit network variant 41, the third cell instance 33 is assigned to the second circuit network variant 42, and the fourth cell instance 34 is assigned to the third circuit network variant 43. The modified data structure 9 as shown in FIG. 5 is formed using these variants. In contrast to the raw data structure 8 for all the instantiations of the first circuit network description 4, this contains one, and only one, polygon data structure, to be precise the sixth polygon data structure 92. The geometrical differences between the circuit network descriptions in the cell instances 31 to 34 are taken into account in the sixth polygon data structure 92 by the circuit network variants 41 to 43, which each contain delta information in the form of difference polygons.

This modified data structure 9 is formed in a manner that particularly optimizes the memory, and is, now, stored on the memory unit of the computer system. The modified data structure 9 can, then, be used to carry out methods and/or programs for checking the circuit layout 5 for faults that are caused by the production process or by the configuration of the integrated electrical circuit. Methods such as these are known to those skilled in the art. The modified data structure 9, which is particularly optimized in terms of memory, allows such methods and/or programs to be carried out at the optimum speed, even for very extensive and very complex integrated electrical circuits.

We claim:

1. A method for checking an integrated electrical circuit to be described by a layout including circuit network descriptions of the integrated electrical circuit, each of the circuit network descriptions being in a form of one of a file and a part of a file on a memory unit of a computer system and each of the circuit network descriptions having at least one polygon each representing one circuit element of the integrated electrical circuit and information regarding electrical characteristics of circuit elements of the integrated electrical circuit, the layout having instantiations of at least one circuit network description and information about a geometrical shape and a configuration of the instantiations with respect to one another, the layout being described by a raw data structure associating each instantiation of a circuit network description with only one polygon data structure, which comprises:

carrying out the following steps with a computer program:
a) selecting a circuit network description from the layout;
b) determining the instantiations of the circuit network description in the layout;
c) determining the respectively geometrically identical and geometrically different instantiations of the circuit network descriptions by analyzing polygon data structures;
d) forming variants for the instantiations of the circuit network descriptions and assigning the instantiations to these variants, geometrically different instantiations being combined into respectively different variants and geometrically matching instantiations being combined into respectively identical variants;
e) forming a new data structure associating the circuit network description with only one polygon data structure, geometrical differences between the instantiations of the same circuit network description being taken into account by variants in the polygon data structure;
f) storing the formed new data structure as one of a file and a part of a file on the memory unit of the computer system; and
g) checking the layout of the integrated electrical circuit using the new data structure stored in step f) for faults caused by a configuration of the integrated electrical circuit.

2. The method according to claim 1, which further comprises, following step d), repeating steps a) to d) in a loop for further circuit network descriptions in the layout.

3. A computerized method, which comprises executing the method according to claim 1 on a computer.

4. A computer-readable medium having computer-executable instructions for performing a method, which comprises the method according to claim 1.

5. A storage medium having computer-executable instructions for performing a method, which comprises the method according to claim 1.

6. A computer memory having computer-executable instructions for performing a method, which comprises the method according to claim 1.

7. The computer memory according to claim 6, wherein the computer memory is a random access memory.

8. An electrical carrier signal carrying computer-executable instructions for performing a method, which comprises the method according to claim 1.

9. A data carrier having computer-executable instructions for performing a method, which comprises the method according to claim 1.

10. A method for downloading a computer program for checking an integrated electrical circuit, which comprises:
providing an electronic data network; and
downloading the computer program according to claim 1 from the electronic data network to the computer.

11. The method according to claim 10, wherein the electronic data network is the Internet and the computer is connected to the Internet.

12. A method for checking an integrated electrical circuit to be described by a layout including circuit network descriptions of the integrated electrical circuit, each of the circuit network descriptions being in a form of one of a file and a part of a file on a memory unit of a computer system and each of the circuit network descriptions having at least one polygon each representing one circuit element of the integrated electrical circuit and information regarding electrical characteristics of circuit elements of the integrated electrical circuit, the layout having instantiations of at least one circuit network description and information about a geometrical shape and a configuration of the instantiations with respect to one another, the layout being extending over a number of levels disposed one above another, the layout being described by a raw data structure associating each instantiation of a circuit network description with only one polygon data structures which comprises:
carrying out the following steps with a computer program:
a) selecting a circuit network description from the layout;
b1) selecting a highest level from the layout;
b2) determining the instantiations of the selected circuit network description on the level selected in step b1);
b3) forming difference polygons by comparing the instantiations on the level selected in step b1) in pairs;
b4) forming variants for instantiations having different difference polygons;
b5) checking the difference polygons acting on circuit network descriptions in a next-lower level;
b6) assigning the instantiations to the variants formed in step b4) based upon the difference polygons;
c1) selecting the next-lower level;
c2) determining the instantiations of the selected circuit network description on the level selected in step c1);
c3) forming difference polygons by comparing the instantiations on the level selected in step c1) in pairs;
c4) combining the difference polygons formed in step c3) with the previously formed difference polygons;
c5) checking the difference polygons acting on circuit network descriptions in a next-lower level;
c6) assigning the instantiations to the variants already having been formed based upon the difference polygons;
c7) forming further variants for instantiations having difference polygons differing from the difference polygons combined in step c4);
c8) assigning the instantiations found in step c7) to the variants formed in step c7);
d1) repeating steps b1) to b5) and c1) to c8) in a loop until a lowest level in the layout has been reached;
e) forming a new data structure associating the circuit network description with only one polygon data structure, geometrical differences between the instantiations of the same circuit network description being taken into account by variants in the polygon data structure;
f) storing the formed new data structure as one of a file and a part of a file on the memory unit of the computer system; and
g) checking the layout of the integrated electrical circuit using the new data structure stored in step f) for faults caused by a configuration of the integrated electrical circuit.

13. The method according to claim 12, which further comprises, following step d1), repeating steps a) to d1) in a loop for further circuit network descriptions in the layout.

14. A computerized method, which comprises executing the method according to claim 12 on a computer.

15. A computer-readable medium having computer-executable instructions for performing a method, which comprises the method according to claim 12.

16. A storage medium having computer-executable instructions for performing a method, which comprises the method according to claim 12.

17. A computer memory having computer-executable instructions for performing a method, which comprises the method according to claim 12.

18. The computer memory according to claim 17, wherein the computer memory is a random access memory.

19. An electrical carrier signal carrying computer-executable instructions for performing a method, which comprises the method according to claim 12.

20. A data carrier having computer-executable instructions for performing a method, which comprises the method according to claim 12.

21. A method for downloading a computer program for checking an integrated electrical circuit, which comprises:
providing an electronic data network; and
downloading the computer program according to claim 12 from the electronic data network to the computer.

22. The method according to claim 21, wherein the electronic data network is the Internet and the computer is connected to the Internet.

23. A method for checking an integrated electrical circuit having circuit elements with electrical characteristics, which comprises:
providing a layout describing the integrated electrical circuit, the layout:
having circuit network descriptions of the integrated electrical circuit, each of the circuit network descriptions:
being in the form of one of a file and a part of a file on a memory unit of a computer system;
having at least one polygon each representing one of the circuit elements; and
having information about the electrical characteristics of the circuit elements;
having at least one of a plurality of instantiations of at least one circuit network description, the instantiations having a geometrical shape and a configuration;
having information about the geometrical shape and the configuration of the instantiations with respect to one another; and
being described by a raw data structure associating each instantiation of a circuit network description with only one of a plurality of polygon data structures; and carrying out the following steps with a computer program:
a) selecting a circuit network description from the layout;
b) determining the instantiations of the circuit network description in the layout;
c) determining the respectively geometrically identical and geometrically different instantiations of the circuit network descriptions by analyzing the polygon data structures;
d) forming variants for the instantiations of the circuit network descriptions and assigning the instantiations to the variants, geometrically different ones of the instantiations being combined into respectively different variants and geometrically matching ones of the instantiations being combined into respectively identical variants;
e) forming a new data structure associating the circuit network description with only one polygon data structure, geometrical differences between the instantiations of the same circuit network description being taken into account by variants in the polygon data structure;
f) storing the formed new data structure as one of a file and a part of a file on the memory unit of the computer system; and
g) checking the layout of the integrated electrical circuit using the new data structure stored in step f) for faults caused by a configuration of the integrated electrical circuit.

24. The method according to claim 23, which further comprises, following step d), repeating steps a) to d) in a loop for further circuit network descriptions in the layout.

25. A computerized method, which comprises executing the method according to claim 23 on a computer.

26. A computer-readable medium having computer-executable instructions for performing a method, which comprises the method according to claim 23.

27. A storage medium having computer-executable instructions for performing a method, which comprises the method according to claim 23.

28. A computer memory having computer-executable instructions for performing a method, which comprises the method according to claim 23.

29. The computer memory according to claim 28, wherein the computer memory is a random access memory.

30. An electrical carrier signal carrying computer-executable instructions for performing a method, which comprises the method according to claim 23.

31. A data carrier having computer-executable instructions for performing a method, which comprises the method according to claim 23.

32. A method for downloading a computer program for checking an integrated electrical circuit, which comprises:
providing an electronic data network; and
downloading the computer program according to claim 23 from the electronic data network to the computer.

33. The method according to claim 32, wherein the electronic data network is the Internet and the computer is connected to the Internet.

34. A method for checking an integrated electrical circuit having circuit elements with electrical characteristics, which comprises:
providing a layout describing the integrated electrical circuit, the layout:
having circuit network descriptions of the integrated electrical circuit, each of the circuit network descriptions:
being in the form of one of a file and a part of a file on a memory unit of a computer system;
having at least one polygon each representing one of the circuit elements; and
having information about the electrical characteristics of the circuit elements;
having at least one of a plurality of instantiations of at least one circuit network description, the instantiations having a geometrical shape and a configuration;
having information about the geometrical shape and the configuration of the instantiations with respect to one another;
extending over a number of levels disposed one above another; and
being described by a raw data structure associating each instantiation of a circuit network description with only one of a plurality of polygon data structures; and
carrying out the following steps with a computer program:
a) selecting a circuit network description from the layout;
b1) selecting a highest level from the layout;
b2) determining the instantiations of the selected circuit network description on the level selected in step b1);
b3) forming difference polygons by comparing the instantiations on the level selected in step b1) in pairs;
b4) forming variants for instantiations having different difference polygons;
b5) checking the difference polygons acting on circuit network descriptions in a next-lower level;
b6) assigning the instantiations to the variants formed in step b4) based upon the difference polygons;
c1) selecting the next-lower level;
c2) determining the instantiations of the selected circuit network description on the level selected in step c1);
c3) forming difference polygons by comparing the instantiations on the level selected in step c1) in pairs;
c4) combining the difference polygons formed in step c3) with the previously formed difference polygons;
c5) checking the difference polygons acting on circuit network descriptions in a next-lower level;
c6) assigning the instantiations to the variants already having been formed based upon the difference polygons;
c7) forming further variants for instantiations having difference polygons differing from the difference polygons combined in step c4);
c8) assigning the instantiations found in step c7) to the variants formed in step c7);
d1) repeating steps b1) to b5) and c1) to c8) in a loop until a lowest level in the layout has been reached;
e) forming a new data structure associating the circuit network description with only one polygon data structure, geometrical differences between the instantiations of the same circuit network description being taken into account by variants in the polygon data structure;
f) storing the formed new data structure as one of a file and a part of a file on the memory unit of the computer system; and
g) checking the layout of the integrated electrical circuit using the new data structure stored in step f) for faults caused by a configuration of the integrated electrical circuit.

35. The method according to claim 34, which further comprises, following step d1), repeating steps a) to d1) in a loop for further circuit network descriptions in the layout.

36. A computerized method, which comprises executing the method according to claim 34 on a computer.

37. A computer-readable medium having computer-executable instructions for performing a method, which comprises the method according to claim 34.

38. A storage medium having computer-executable instructions for performing a method, which comprises the method according to claim 34.

39. A computer memory having computer-executable instructions for performing a method, which comprises the method according to claim 34.

40. The computer memory according to claim 39, wherein the computer memory is a random access memory.

41. An electrical carrier signal carrying computer-executable instructions for performing a method, which comprises the method according to claim 34.

42. A data carrier having computer-executable instructions for performing a method, which comprises the method according to claim 34.

43. A method for downloading a computer program for checking an integrated electrical circuit, which comprises:
  providing an electronic data network; and
  downloading the computer program according to claim 34 from the electronic data network to the computer.

44. The method according to claim 43, wherein the electronic data network is the Internet and the computer is connected to the Internet.

* * * * *